United States Patent
Ghosh et al.

(10) Patent No.: US 10,312,076 B2
(45) Date of Patent: Jun. 4, 2019

(54) APPLICATION OF BOTTOM PURGE TO INCREASE CLEAN EFFICIENCY

(71) Applicant: Applied Materials, Inc., Santa Clara, CA (US)

(72) Inventors: Kalyanjit Ghosh, San Jose, CA (US); Sanjeev Baluja, Campbell, CA (US); Mayur G. Kulkarni, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/917,079

(22) Filed: Mar. 9, 2018

(65) Prior Publication Data

US 2018/0261453 A1    Sep. 13, 2018

Related U.S. Application Data

(60) Provisional application No. 62/469,914, filed on Mar. 10, 2017.

(51) Int. Cl.
| | |
|---|---|
| H01L 21/02 | (2006.01) |
| H01J 37/32 | (2006.01) |
| C23C 16/455 | (2006.01) |
| C23C 16/44 | (2006.01) |
| C23C 16/40 | (2006.01) |
| C23C 16/458 | (2006.01) |
| C23C 16/50 | (2006.01) |

(52) U.S. Cl.
CPC ...... *H01L 21/02274* (2013.01); *C23C 16/401* (2013.01); *C23C 16/4408* (2013.01); *C23C 16/4412* (2013.01); *C23C 16/4585* (2013.01); *C23C 16/45502* (2013.01); *C23C 16/50* (2013.01); *H01J 37/3244* (2013.01); *H01J 37/32862* (2013.01); *H01L 21/02208* (2013.01)

(58) Field of Classification Search
CPC .......... H01L 21/02274; H01L 21/02208; H01J 37/3244; H01J 37/32862; C23C 16/45502; C23C 16/4408

See application file for complete search history.

(56) References Cited

U.S. PATENT DOCUMENTS

| | | |
|---|---|---|
| 5,810,936 A | 9/1998 | Leung et al. |
| 5,846,332 A | 12/1998 | Zhao et al. |
| 5,885,356 A | 3/1999 | Zhao et al. |
| 5,895,530 A | 4/1999 | Shrotriya et al. |
| 5,919,332 A | 7/1999 | Koshiishi et al. |
| 6,026,762 A | 2/2000 | Kao et al. |
| 6,159,299 A | 12/2000 | Koai et al. |
| 6,274,058 B1 | 8/2001 | Rajagopalan et al. |

(Continued)

*Primary Examiner* — Karen Kusumakar
(74) *Attorney, Agent, or Firm* — Patterson + Sheridan LLP (57) ABSTRACT

Apparatus and methods for depositing a film in a PECVD chamber while simultaneously flowing a purge gas from beneath a substrate support are provided herein. In embodiments disclosed herein, a combined gas exhaust volume circumferentially disposed about the substrate support, below a first volume and above a second volume, draws processing gases from the first volume down over an edge of a first surface of the substrate support and simultaneously draws purge gases from the second volume upward over an edge of a second surface of the substrate support. The gases are than evacuated from the combined exhaust volume through an exhaust port fluidly coupled to a vacuum source.

20 Claims, 4 Drawing Sheets

(56) References Cited

U.S. PATENT DOCUMENTS

| | | |
|---|---|---|
| 6,582,522 B2 | 6/2003 | Luo et al. |
| 6,645,884 B1 | 11/2003 | Yang et al. |
| 6,663,714 B2 | 12/2003 | Mizuno et al. |
| 7,816,272 B2 | 10/2010 | Tsutae |
| 8,252,410 B2 | 8/2012 | Rasheed |
| 8,366,953 B2 | 2/2013 | Kohno et al. |
| 9,528,183 B2 | 12/2016 | Wu et al. |
| 2006/0086259 A1* | 4/2006 | Okajo ............... H01J 37/3244 99/342 |
| 2008/0178801 A1 | 7/2008 | Pavloff et al. |
| 2011/0268892 A1* | 11/2011 | Oda .................... C01B 33/035 427/593 |
| 2012/0009765 A1 | 1/2012 | Olgado |
| 2012/0237693 A1 | 9/2012 | Jackson et al. |
| 2014/0262026 A1 | 9/2014 | Forster et al. |
| 2014/0326276 A1 | 11/2014 | Wu et al. |
| 2015/0255259 A1 | 9/2015 | Li et al. |
| 2016/0312359 A1 | 10/2016 | Dubois et al. |
| 2017/0178758 A1 | 6/2017 | Ha et al. |
| 2017/0275753 A1 | 9/2017 | Baluja et al. |

\* cited by examiner

APPLICATION OF BOTTOM PURGE TO INCREASE CLEAN EFFICIENCY

CROSS-REFERENCE TO RELATED APPLICATIONS

This application claims priority to U.S. Provisional Patent Application Ser. No. 62/469,914, filed on Mar. 10, 2017, which is herein incorporated by reference in its entirety.

BACKGROUND

Field

Embodiments described herein generally relate to the field of semiconductor device manufacturing, and more particularly, to chemical vapor deposition chambers (CVD) and methods of purging a portion of a processing volume in the CVD chamber while simultaneously deposing a material layer on a substrate surface.

Description of the Related Art

Deposition processes, such as chemical vapor deposition (CVD) and plasma enhanced CVD (PECVD) processes, are commonly used in semiconductor device manufacturing to deposit material layers on a substrate surface by reacting one or more gaseous precursors, or activated species thereof, with or on the substrate surface. Gaseous precursors typically include one or both of gas-phase precursors and vapor-phase precursors.

Unfortunately, gaseous precursors, and the reaction byproducts thereof, also undesirably deposit material, herein residue material, on surfaces of the walls and other components disposed in the processing volume of the processing chamber. Typically, with every substrate processed the thickness of the residue material deposits increases. Thick residue material deposits will eventually flake from the processing chamber surfaces leading to undesirable particulate contamination in the processing volume, which negatively affects the quality of the material layer deposited on the substrate. Therefore, CVD and PECVD processing chambers must be periodically cleaned to remove residue material therefrom. Typically, chamber cleaning includes one or both of periodic cleaning cycles between substrate processing operations and opening the chamber for cleaning and scheduled maintenance, both of which result in lower substrate throughput and increased chamber downtime (time unavailable for substrate processing) and, therefore, lost production capacity of the processing chamber.

Accordingly, there is a need in the art for apparatus and methods to prevent undesirable deposition of unreacted precursors and the reaction byproducts thereof on surfaces in the processing volume of a processing chamber.

SUMMARY

Embodiments disclosed herein generally provide methods, and apparatus related thereto, of depositing a material layer on a substrate disposed on a substrate support in a CVD chamber while simultaneously flowing a purge gas from beneath the substrate support.

In one embodiment, a method of processing a substrate includes positioning the substrate on a first surface of a substrate support disposed in a processing volume of a processing chamber, the processing chamber comprising a chamber body having a chamber base, one or more sidewalls, and a chamber lid defining the processing volume. Herein the processing volume comprises a first volume and a second volume. The first volume is defined by a plane of the first surface and a showerhead. The second volume is defined by a plane of a second surface of the substrate support, opposite the first surface and substantially parallel thereto, and a chamber base. The method further includes flowing a purge gas into the second volume, flowing one or more gaseous precursors into the first volume, forming a plasma of the one or more gaseous precursors, exposing the substrate to the plasma, and depositing a material layer on the substrate. The method further includes simultaneously, with depositing a material layer on the substrate, evacuating a processing gas comprising one or both of unreacted gaseous precursors and gaseous precursor reaction byproducts and the purge gas from the processing volume through a gas exhaust volume disposed between the plane of the first surface and the chamber base. Herein, the processing gas is evacuated from the first volume to the combined gas exhaust volume through a first gas inlet and the purge gas is evacuated from the second volume to the combined gas exhaust volume through a second gas inlet. Typically, an opening into the combined gas exhaust volume from the first gas inlet is located below the plane of the first surface and an opening into the combined gas exhaust volume from the second gas inlet is located above the plane of the second surface.

In another embodiment, a method of processing a substrate includes positioning a substrate on a first surface of a substrate support disposed in a processing volume of a processing chamber. The processing volume comprises a first volume disposed between a chamber lid and the substrate support and a second volume disposed between the substrate support and a chamber base. The method further includes heating the substrate to a temperature between about 350° C. and about 550° C., flowing a purge gas into the second volume, the purge gas comprising O2, and flowing a gaseous precursor comprising TEOS into the first volume. The method further includes forming a plasma of the gaseous precursor, exposing the substrate to the plasma, and depositing an oxide layer on the substrate while simultaneously evacuating a processing gas and the purge gas from the second volume. Herein, the processing gas comprises one or both of unreacted TEOS or TEOS reaction byproducts. The processing gas and the purge gas are evacuated through a combined gas exhaust volume disposed between a plane of a first surface of the substrate support and the chamber base. The processing gas is evacuated from the first volume through a first gas inlet to the combined gas exhaust volume and the purge gas is evacuated from the second volume through a second gas inlet to the combined gas exhaust volume. An opening into the combined gas exhaust volume from the first gas inlet is located below the plane of the first surface and an opening into the combined gas exhaust volume from the second gas inlet is located above the plane of the second surface.

In another embodiment, a processing chamber includes a chamber base, one or more sidewalls, and a chamber lid defining a processing volume. The processing chamber further includes a substrate support disposed in the processing volume, the substrate support having a first surface, a second surface opposite the first surface, and a third surface connecting the first surface and the second surface around the circumference of the substrate support. The processing chamber further includes a first liner disposed in a circumferential channel in the chamber body, a second liner disposed radially inwardly of the first liner, and a third liner disposed radially inwardly of the one or more sidewalls between the first liner and the chamber lid. Herein, the first liner and the second liner define an exhaust channel. The second liner, the third liner, and the third surface of the substrate support define a combined gas exhaust volume when the substrate support is in a raised position. A first inlet to the combined gas exhaust volume is disposed between the substrate support and the third liner and a second inlet to the combined gas exhaust volume is disposed between the substrate support and the second liner when the substrate support is in the raised position. Herein, an opening into the combined gas exhaust volume from the first inlet is below the plane of the first surface and an opening into the combined gas exhaust volume form the second inlet is above the plane of the second surface when the substrate support is in the raised position.

BRIEF DESCRIPTION OF THE DRAWINGS

So that the manner in which the above recited features of the present disclosure can be understood in detail, a more particular description of the invention, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein provide apparatus, and methods related thereto, for preventing unreacted gaseous precursors and gaseous precursor reaction byproducts, herein collectively called processing gas, from flowing into a portion of a processing volume disposed between a substrate support and a chamber base, herein a second volume, during chemical vapor deposition (CVD) or plasma enhanced chemical vapor deposition (PECVD) processes without negatively impacting material layer deposition rates, material layer thickness uniformity, and material layer film quality. Embodiments herein further provide for uniform removal of the processing gas from a portion of the processing volume disposed between the substrate support and a chamber lid, herein a first volume, and reduced residence time of the processing gas therein. Uniform removal of processing gas from the first volume directly affects the material layer film quality and material layer thickness uniformity across the surface of the substrate. Typically, reduced residence time of processing gas in the first volume desirably increases the deposition rate of the material layer.

Typically, during conventional CVD and PECVD processes, processing gases are removed from a portion of a processing volume, herein a first volume, located between a substrate support and a gas showerhead, through an exhaust channel circumferentially disposed in a chamber wall and coplanar with a surface of a substrate disposed on a substrate support. The exhaust channel draws processing gases radially outward from a center region of the first volume, where the center region is above the center of the substrate. The processing gas is then removed from the exhaust channel through an exhaust port circumferentially, or substantially circumferentially, formed through the chamber wall and fluidly coupled to a vacuum source, such as one or more dedicated vacuum pumps. Here, the exhaust channel is located around the first volume and above the plane of the substrate support.

Typically, at least some of the processing gases not captured by the conventional exhaust system described above undesirably flow into a portion of the processing volume disposed between the substrate support and the chamber base, herein a second volume, where they undesirably deposit residue material on the chamber walls, the chamber base, and other chamber components. In particular, unreacted tetraethoxysilane (TEOS) deposits residue material on chamber surfaces that are not heated (or heated to a relatively low temperature) more readily than on surfaces that are heated (such as the substrate support and the faceplate of a showerhead). One method of preventing processing gases from entering the second volume is to pressurize the second volume relative to the first volume by flowing a purge gas thereinto. However, in a conventional processing chamber configuration, purge gas cannot be used to pressurize the second volume without being drawn into the exhaust channel described above and resultantly negatively affect the uniform removal of processing gases from the first volume. Additionally, in a PECVD chamber with in-situ plasma generation, purge gas introduced into the first volume, or an exhaust channel adjacent thereto, may form an undesirable secondary plasma and, or, cause undesirable arcing between the substrate support and the chamber walls.

Therefore, in embodiments disclosed herein, a combined gas exhaust volume circumferentially disposed about the substrate support, at a location below the first volume and above the second volume, draws processing gases from the first volume down over an edge of a first surface of the substrate support and simultaneously draws purge gas from the second volume upward and over an edge of a second surface of the substrate support. The combined processing gases and purge gas are then evacuated from the combined exhaust volume into an exhaust pumping channel and out of the exhaust pumping channel through an exhaust port fluidly coupled to a vacuum source. Locating the combined gas exhaust volume below the first volume and above the second volume prevents purge gases from entering the first volume while simultaneously preventing processing gases from entering the second volume and depositing on the surfaces thereof. Therefore, benefits of embodiments herein include reduced deposition of residue material on the chamber walls and chamber components in the second volume, fewer required clean cycles, more time between scheduled maintenance, and, therefore, increased production capacity.

Figure 1:
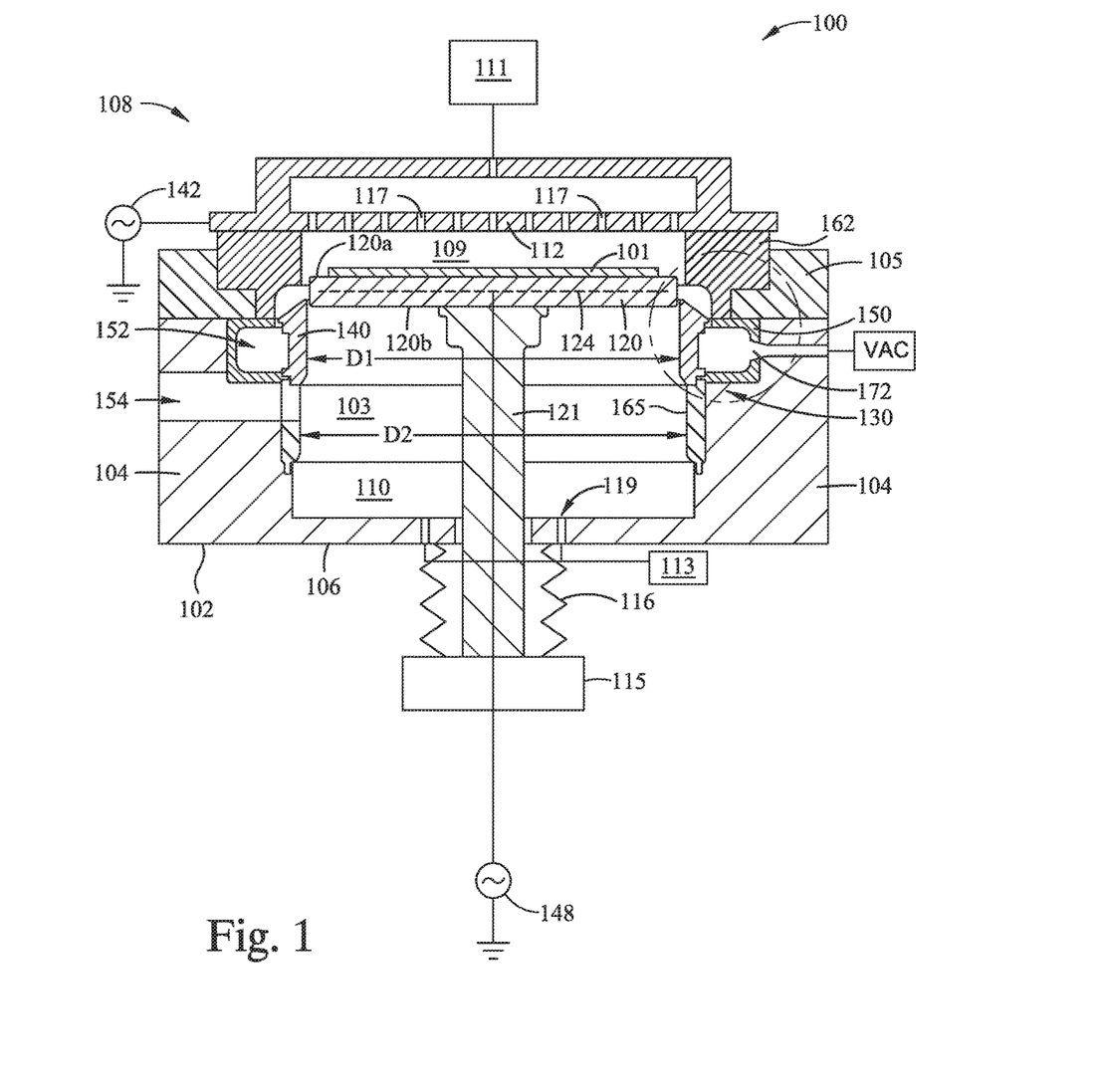
FIG. 1 is a schematic sectional view of an exemplary processing chamber configured to practice the methods set forth herein, according to one embodiment.

FIG. 1 is a schematic sectional view of an exemplary processing chamber configured to practice the methods described herein, according to one embodiment. The processing chamber 100 includes a chamber body 102 having one or more sidewalls 104, a chamber base 106, and a chamber lid assembly 108 which together define a processing volume 103, and a substrate support 120 disposed in the processing volume 103. The processing volume 103 includes a first volume 109 and a second volume 110. The first volume 109 is defined by the inner surface of the sidewalls 104, the inner surface of the chamber lid assembly 108 and the chamber lid assembly facing surface(s) of the substrate support 120, such as the first surface 120a, when the substrate support 120 is in a raised, substrate processing, position (as shown). The second volume is defined by the inner surface of the one or more sidewalls 104, the chamber base facing surface(s) of the substrate support 120, such as the second surface 120b, when the substrate support is in the raised, substrate processing, position and the inner surface of the chamber base 106. Typically, the first volume 109 is less than about 10% of the processing volume 103, such as less than about 5% thereof.

Herein, the chamber lid assembly 108 is electrically isolated from the one or more sidewalls 104 by an $Al_2O_3$ isolator ring, herein the T-liner 162, disposed therebetween. A showerhead 112, disposed in the chamber lid assembly 108 and coupled thereto, has a plurality of openings 117 disposed therethrough, which uniformly distribute one or more gaseous precursors from a precursor source 111 into the first volume 109. Herein, the showerhead 112 is formed of an electrically conductive material, for example aluminum, and is coupled to a first power supply 142, such as an RF power supply, which supplies power to ignite and maintain a plasma of the gaseous precursors through capacitive coupling therewith. In some embodiments, at least one of DC power or pulsed DC power, of positive or negative polarity, and of pulsed RF power is also coupled to the showerhead 112.

Figure 2:
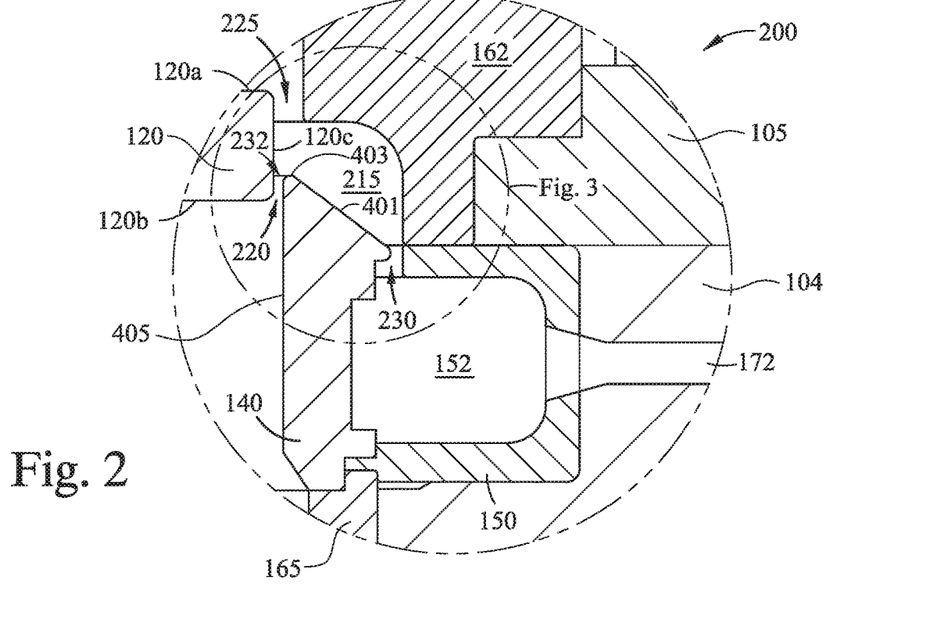
FIG. 2 is a close up view of a portion of FIG. 1.

The substrate support 120 includes the first surface 120a facing the chamber lid assembly 108 for receiving a substrate 101, the second surface 120b opposite the first surface 120a and facing the chamber base 106, and a circumferential third surface 120c, shown in FIG. 2, connecting the first surface 120a and the second surface 120b. Herein, the third surface 120c faces the one or more sidewalls 104 and is orthogonal to the first and second surfaces 121a, b. Here, the first surface 120a has a first plane and the second surface 120b has a second plane substantially in parallel with the first plane. Herein, substantially parallel at least means that the first plane and the second plane will not intersect within the processing volume 103 of the processing chamber 100.

Typically, during processing to form a thin film thereon, a substrate 101 is secured to the first surface 120a of the substrate support 120 by an electrostatic chucking (ESC) force. The chucking force is a function of a potential between a voltage provided to a chucking electrode 124 embedded in a dielectric material of the substrate support 120 and the substrate 101 disposed thereon. Typically, the chucking electrode 124 is coupled to a second power supply 148, such as a DC power supply. In some embodiments, the substrate support 120 includes one or more heaters (not shown), such as one or more resistive heating elements, embedded therein. In some embodiments, the substrate support 120 includes one or more cooling channels (not shown) disposed therein that are fluidly coupled to, and in fluid communication with, a coolant source (not shown) through one or more coolant lines (not shown). Typically, the coolant source is a refrigerant source or water source having a relatively high electrical resistance. In some embodiments, the substrate support 120 includes both of one or more heaters and one or more cooling channels to enable fine control of the temperature of the substrate support 120 and the substrate 101 disposed thereon.

The substrate support 120 is coupled to a support shaft 121 which is coupled to a lift actuator 115 which raises and lowers the support shaft 121, and the substrate support 120 coupled thereto, to facilitate processing of the substrate 101 and transfer thereof to and from the processing chamber 100. A bellows 116, circumscribing the support shaft 121, is coupled to the chamber base 106 and to the lift actuator 115 to provide a flexible seal therebetween and to maintain the vacuum integrity of the processing volume 103. The lift actuator 115 is configured to move the substrate support 120 between a lowered position (not shown), to facilitate transfer of the substrate 101 to and from the processing volume 103 and a raised position, as shown, for processing of the substrate 101.

The substrate 101 is loaded into, and removed from, the processing volume 103 through an opening 154 in one of the one or more sidewalls 104, which is conventionally sealed with a door or a valve (not shown) during substrate processing. Typically, the processing chamber 100 further includes a conventional lift pin system (not shown) used to lift the substrate 101 from the substrate support 120 when the substrate support 120 is in a lowered position (not shown) which enables access to the substrate 101 by a robot handler (not shown).

Herein, a purge gas is delivered to the second volume 110 during substrate processing or chamber cleaning operations. The purge gas flows into the second volume 110 through one or more openings 119 disposed through the chamber base 106 around the support shaft 121 or at one or more locations radially outward therefrom. Herein, the one or more openings 119 have a symmetrical cross sectional shape, such as a circular cross sectional shape. In other embodiments, the one or more opening 119 have an asymmetrical cross sectional shape. The purge gas is provided by a purge gas source 113 in fluid communication with the one or more openings 119.

An exhaust liner assembly 130, disposed in the processing volume 103, is configured to reduce undesirable residue material deposition on the inner walls of the chamber body 102 and on surfaces of chamber components disposed in the second volume 110, by facilitating the uniform removal of processing gases from the first volume 109, and to prevent purge gas from flowing into the first volume 109 from the second volume 110. The exhaust liner assembly 130 includes a circumferential, C-channel shaped in section, liner 150, hereafter C-shaped liner 150, a circumferential, T-shaped in section, liner 162, hereafter T-shaped liner 162, and a circumferential top liner 140 which define flow pathways of the processing gases and the purge gas during substrate processing, as further described in FIGS. 2 and 3. In some embodiments, the processing chamber 100 further includes a circumferential bottom liner 165, disposed between the top liner 140 and the chamber base 106, which lines at least a portion of the surface of the one or more sidewalls 104 facing the processing volume 103. Herein, an inner diameter $D_1$ of the top liner 140 measured at an inner wall 405 thereof (shown in FIG. 4) is less than an inner diameter $D_2$ of the bottom liner 165.

Herein, the respective liners 140, 150, 162, and 165 are made from a ceramic material, such as aluminum oxide, or other material which is suitably resistant to heat and corrosion from halogen containing cleaning plasmas, such as $NF_3$ based plasma. Typically, the liners 140, 150, and 162 are periodically removed from the processing chamber 100 for scheduled cleaning or replacement.

Figure 3:
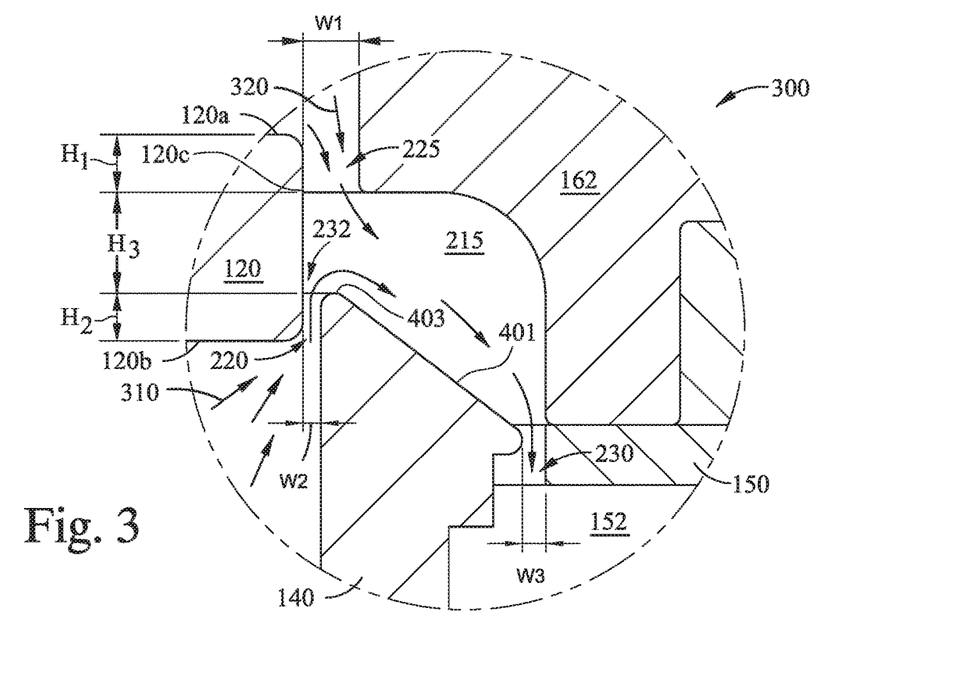
FIG. 3 is a close up view of a portion of FIG. 2.

FIG. 2 is a close up view of a portion of FIG. 1. FIG. 3 is a close up view of a portion of FIG. 2 illustrating flow pathways of the processing gas 320 and the purge gas 310 during substrate processing in the process chamber 100. Herein, the C-channel liner 150 is disposed in a circumferential channel located below the substrate support 120 and radially outwardly therefrom. The circumferential channel is defined by the T-liner 162, one or more sidewalls 104, and a top plate 105 secured to the one or more sidewalls 104. The top plate 105 is located adjacent to the T-liner 162 and disposed radially outwardly therefrom. The circumferential channel and the C-channel liner 150 disposed therein, are located below the second plane of the substrate support 120 and the chamber base 106 when the substrate support 120 is in a raised, substrate processing, position. A portion of the T-liner 162 extends radially inwardly of the one or more sidewalls 104, at a location between the C-channel liner 150 and the chamber lid assembly 108 an along the inner surface of the chamber lid assembly 108, and terminates radially outwardly from, but proximate, to the substrate support 120 when the substrate support 120 is in the raised, substrate processing position. The top liner 140 is disposed radially inwardly of the C-channel liner 150 and the T-liner 162. Surfaces of the top liner 140 and the C-channel liner 150 define an exhaust channel 152 which is in fluid communication with the vacuum source, such as one or more dedicated vacuum pumps, through an exhaust port formed through the C-channel liner 150 and further through one of the one or more sidewalls 104.

Herein, the third surface 120c of the substrate support 120 (in the raised position), the top liner 140, and the T-liner 162 define a combined gas exhaust volume 215 having a first inlet 225, a second inlet 220, and having a height $H_3$ between the openings of the first inlet 225 the second inlet 220 thereinto. The first inlet 225 is located between the inward terminal wall of the T-liner 162 and the third surface 120c of the substrate support 120. The second inlet 220 is located between an inner wall 405 of the top liner 140 and the third surface 120c of the substrate support 120. The first inlet 225 has a width $W_1$ between about 0.5 mm and about 10 mm, such as between about 2 mm and about 5 mm, across the gap between the inward terminal wall of the T-liner 162 and the third surface 120c of the substrate support 120. The second inlet 220 has a width $W_2$ between about 0.5 mm and about 5 mm, such as between about 1 mm and about 3 mm, such as about 2 mm across the gap between the inner wall 405 of the top liner 140 and the third surface 120c the substrate support 120. Typically, the width $W_2$ of the second inlet 220 is determined by the inner diameter $D_1$ of the top liner 140 and can be changed by using a different top liner 140 having a different inner diameter D1.

Herein, an opening of the first inlet 225 into the combined gas exhaust volume 215 is located below a plane of the first surface 120a by a height $H_1$ so that processing gas 320 from the first volume 109 flows radially outward from a region above the center of the substrate 101 disposed therein and around the circumferential edge of the first surface 120a into the combined exhaust volume 215. The opening of the second inlet 220 into the combined gas exhaust volume 215 is located above a plane of the second surface 120b by a height $H_2$ so that purge gas is drawn into combined gas exhaust volume 215 and blocks processing gas 320 from flowing into the second volume 210.

Herein, the height $H_3$ of the combined gas exhaust volume 215 between the openings of the first inlet 225 and second inlet 220 thereinto is at least the sum of the width $W_1$ of the first inlet and the width $W_2$ of the second inlet 220 so that the flow of the processing gas 320 and the flow of the purge gas 310 into the combined gas exhaust volume 215 from the respective inlets 225 and 220 are unrestricted.

An outlet 230 from the combined gas exhaust volume 215 into the exhaust channel 152 is defined by a circumferential wall at the inner terminus of an arm of the C-channel liner 150 and a sidewall facing surface of the top liner 140. The outlet 230 has a width $W_3$ of between about 0.5 mm and about 10 mm, for example between about 2 mm and about 7 mm.

During substrate processing, the processing gas 320 in the first volume 109 is drawn radially outward from the region above the center of a substrate disposed therein and down over the circumferential edge of the first surface 120a of the substrate support 120 into the combined gas exhaust volume 215 through the first inlet 225. Simultaneously, purge gas 310 in the second volume 110 is drawn into the combined gas exhaust volume 215 through the second inlet 220. Both the processing gas 320 and purge gas 310 are then drawn from the combined gas exhaust volume 215 through the outlet 230 and into the exhaust channel 152 where they are evacuated from the processing chamber 100 through the exhaust port 172. Herein, an angled outer wall 401 of the top liner 140, facing the combined gas exhaust volume 215, directs processing gas 320 flowing through the first inlet 225 away from the second inlet 220 to prevent the processing gas 320 from undesirably entering the second volume 110.

Positioning the exhaust channel 152 such that a gas outlet of the first volume 109 (shown as gas inlet 225 to the combined gas exhaust volume 215) extends below the first surface 120a of the substrate support 120, and such that the gas outlet of the second volume 110 (shown as gas inlet 220 to the combined gas exhaust volume 215) extends above the second surface 120b of the substrate support 120, enables the pull of the vacuum in the exhaust channel 152 in fluid communication with the processing volume 103 to cause processing gas 320 from above the substrate support 120 and purge gas 310 from below the substrate support 120 to simultaneously enter the combined gas exhaust volume 215 without crossing between the respective first and second volumes 109 and 110. Further, by drawing the processing gas 320 down over the circumferential edge of the first surface 120a of the substrate support 120 through the restrictive first inlet 225 the residence time of the processing gas 320 in the first volume 109 is reduced when compared to conventional processing chamber where processing gas is evacuated from the processing volume through an exhaust channel coplanar with a surface of the substrate. The width of opening 232 is defined by the extension of the nose 403 formed at the outward terminus of the surface of the angled outer wall 401 from the circumferential surface of the inner wall 405 of the top liner 140.

Figure 4:
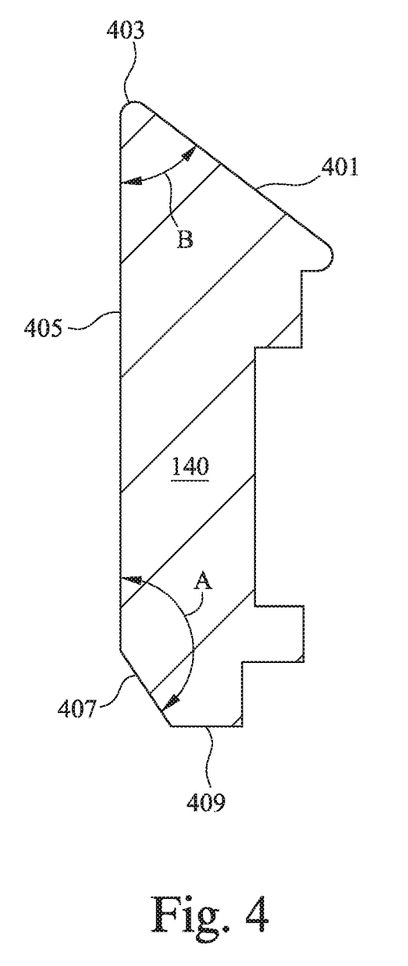
FIG. 4 illustrates a sectional shape of the top liner shown in FIGS. 1-3, according to one embodiment.

FIG. 4 illustrates a sectional shape of the top liner shown in FIGS. 1-3, according to one embodiment. Herein, the top liner 140 includes at least an inner wall 405, an angled outer wall 401 connected to the inner wall 405 by a rounded first end, here the nose 403, of the top liner 140, and a conical wall 407 connecting a second end 409 of the top liner 140 to the inner wall 405. When disposed in the processing chamber 100, the inner wall 405 is substantially in parallel with the third surface 120c of the substrate support 120 about the outer circumference thereof. Herein, the angled outer wall 401 and the inner wall 405 form an angle B of less than about 80°, such as less than about 70°, such as less than about 60°, or between about 30° and about 80°, such as between about 45° and about 60°. The conical wall 407 connected to the inner wall 405 extends radially outwardly from the conical wall 407 towards the second end 409.

Typically, the second end 409 of the top liner 140 rests on a surface of the bottom liner 165 when the top liner 140 is disposed in the processing chamber 100. Herein, the inner wall 405 and the conical wall 407 form an angle A of between about 120° and about 160° and an inner diameter of the conical wall 407 proximate to the second end is about the same as the inner diameter $D_2$ of the bottom liner 165, shown in FIG. 1. During substrate processing the conical wall 407 directs purge gas introduced through the one or more openings 119 in the chamber base towards the second inlet 220 to the combined gas exhaust volume 215. The width of opening 232 is defined by the extension of the nose 403 formed at the outward terminus of the angled outer wall 401 from the circumferential surface of the inner wall 405 of the top liner 140.

Figure 5:
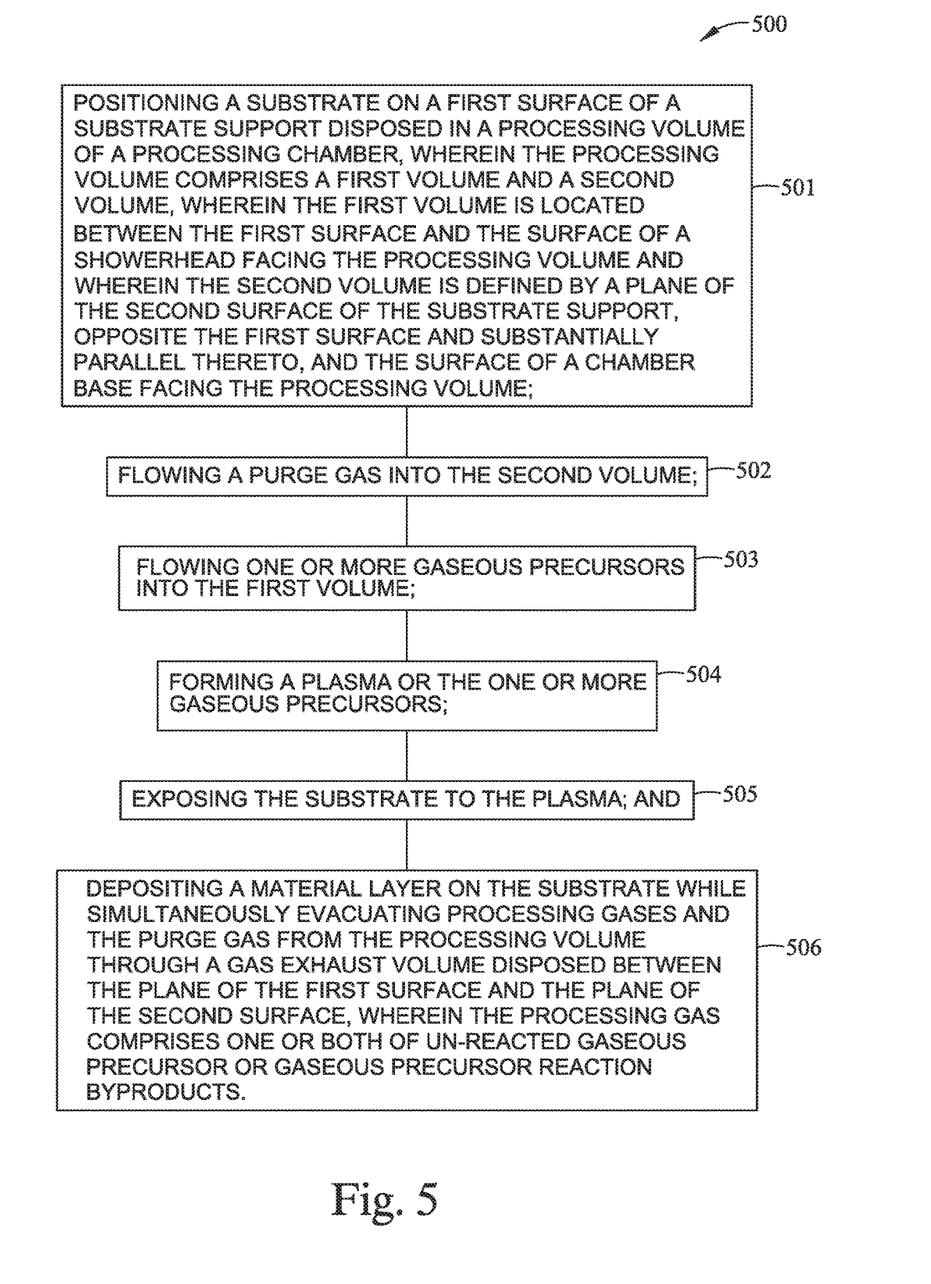
FIG. 5 is a flow diagram of a method of processing a substrate, according to one embodiment.

FIG. 5 is a flow diagram of a method of processing a substrate, according to one embodiment. At activity 501 the method 500 includes positioning the substrate on the first surface of a substrate support disposed in a processing volume of a processing chamber. Herein, the processing volume comprises a first volume and a second volume. The first volume is defined by the inner surface of the side walls of the chamber, a plane of the first surface, and the first volume facing surface of a showerhead. The second volume is defined by the inner surface of the side walls of the chamber, a plane of the second surface of the substrate support, opposite the first surface and oriented substantially parallel thereto, and the second surface facing surface of a chamber base.

At activity 502 the method 500 includes flowing a purge gas into the second volume. Typically, the purge gas comprises one or both of an inert gas, such as $N_2$, Ar, Ne, Kr, or a combination thereof, and an oxygen containing gas, such as $O_2$, $N_2O$, $CO_2$, or a combination thereof. The purge gas is selected, in part, based on a breakdown voltage thereof (the minimum voltage necessary to ignite a plasma formed of the purge gas between two electrodes as a function of gas pressure, voltage drop between the electrodes, such as between an RF biased substrate support and grounded chamber sidewalls, and the gap width). In one embodiment, the purge gas comprises $O_2$ which is desirably resistant to forming a plasma in the gaps forming the exhaust channels through capacitive coupling with an RF bias voltage provided to the substrate support, and desirably resistant to causing arcing from the substrate support through the liners adjacent thereto, under the processing conditions and chamber configurations described herein.

At activities 503, 504, and 505 the method 500 includes respectively flowing one or more gaseous precursors into the first volume; forming a plasma of the one or more gaseous precursors; exposing the substrate to the plasma; and depositing a material layer on the substrate. Activity 505 of the method 500 further includes simultaneously (with depositing the material layer) evacuating a processing gas comprising one or both of unreacted gaseous precursor or gaseous precursor reaction byproducts and the purge gas from the processing volume through a gas exhaust volume at least partially disposed between the plane of the first surface and the plane of the second surface.

Herein, the plasma is formed by capacitive coupling with the one or more gaseous precursors, where a power provided to the showerhead disposed in the chamber lid, or to a faceplate of the showerhead, is between about 100 W and about 3000 W. In other embodiments, the processing chamber comprises an inductive plasma generator and the plasma is formed through inductive coupling with the one or more gaseous precursors.

In some embodiments, the one or more gaseous precursors comprise a silicon-containing precursor, such as silane, dimethylsilane, trimethylsilane, tetramethylsilane, diethylsilane, tetramethylorthosilicate (TMOS), tetraethylorthosilicate (TEOS), octamethyltetrasiloxane (OMTS), octamethylcyclotetrasiloxane (OMCTS), tetramethylcyclotetrasiloxane (TOMCATS), or a mixture thereof. In some embodiments, the one or more gaseous precursors comprise a mixture of a silicon-containing precursor and an oxygen containing precursor, such as oxygen ($O_2$), ozone ($O_3$), NO, $NO_2$, or a mixture thereof, and, or a hydroxyl-containing precursor such as $H_2O$, hydrogen peroxide, or mixtures thereof. In some embodiments, the one or more gaseous precursors are combined a carrier gas such as He, $N_2$, Ar or a combination thereof before flowing into the processing volume.

In one embodiment, the deposited material layer comprises silicon oxide, the gaseous precursor comprises TEOS, and a purge gas introduced into the second volume through one or more openings in the chamber base comprises $O_2$. Typically, the TEOS precursor flowrate is between about 5 grams per minute (gm/min) and about 30 gm/min, such as about 5 gm/min and about 25 gm/min. The processing volume is typically maintained at a pressure between about 10 mTorr and about 20 Torr, such as between about 1 Torr and about 10 Torr. The substrate is maintained at a temperature between about 350° C. and about 550° C., such as between about 400° C. and about 500° C., for example about 425° C. The temperature of a face plate of the showerhead is maintained between about 100° C. and about 300° C. An Ar carrier gas flowrate is between about 1 slm and about 20 slm, such as between about 5 slm and about 15 slm. The $O_2$ purge gas flowrate is between about 1 slm and about 20 slm, such as between about 1 slm and about 10 slm, such as about 5 slm. A spacing between the first surface of the substrate support and the showerhead is between about 150 mil and about 300 mil, such as about 200 mil and about 250 mil. The above values are for a processing chamber sized to process a 300 mm substrate, appropriate scaling may be used for processing chambers sized for other substrates.

Embodiments herein enable the flow of purge gas into the processing region below a substrate support while simultaneously depositing a thin film layer on substrate disposed in a processing region above the substrate support and evacuating processing gases therefrom. By positioning a combined gas exhaust volume radially outward from the substrate support, locating the inlets to the combined gas volume between planes of the upper and lower surfaces of the substrate support, and extending the inlets above and below the respective upper and lower surfaces of the substrate support, processing gases and purge gas are simultaneously evacuated from the respective upper and lower regions of the processing volume without crossing therebetween. In particular, by configuring the second inlet 220 to extend from the lower surface 120b of the support 120 at the circumferential perimeter thereof below the location of volume 215, along the outer wall of the support, herein the third surface 120c, and then into the volume 215, and configuring the inlet 225 to extend from the location of the upper surface 120b of the support 120 at the circumferential perimeter thereof above the location of volume 215, along the third surface 120c of the support, and then into the volume 215, transit of the gas flowing from below the support into the first volume 109, and transit of the gas flowing from above the support into the second volume 110, is reduced or eliminated. This effect is maintained even where the upper and lower surfaces (first and second surfaces 120a, 120b) are not planar, so long as at least one of, preferably both, of the outer perimeter of the lower surface (second surface 120b) is maintained below the opening of the second inlet 220 to the combined gas exhaust volume 215, and the outer perimeter of the upper surface (first surface 120a) is maintained above the opening of the first inlet into the volume 215. Benefits of the disclosure include reduced deposition of undesirable films and residues on the chamber walls and on the chamber components disposed beneath the substrate support which will desirably result in fewer required cleaning cycles, greater time between scheduled maintenance procedures, and an overall increase in the production capacity of the processing chamber.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a substrate, comprising:
   positioning the substrate on a first surface of a substrate support disposed in a processing volume of a processing chamber, the processing chamber comprising a chamber body having a chamber base, one or more sidewalls, and a chamber lid defining the processing volume,
   wherein the processing volume comprises a first volume and a second volume,
   wherein the first volume is located between the first surface and a surface of a showerhead facing the processing volume, and
   wherein the second volume is defined by a plane of a second surface of the substrate support, opposite the first surface and substantially parallel thereto, and the surface of a chamber base facing the processing volume;
   flowing a purge gas into the second volume;
   flowing one or more gaseous precursors into the first volume;
   forming a plasma of one or more gaseous precursors;
   exposing the substrate to the plasma; and
   depositing a material layer on the substrate while simultaneously evacuating a processing gas comprising one or both of unreacted gaseous precursor or gaseous precursor reaction byproducts and the purge gas from the processing volume through a gas exhaust volume disposed between the plane of the first surface and the chamber base,
   wherein the processing gas is evacuated from the first volume to a combined gas exhaust volume through a first gas inlet and the purge gas is evacuated from the second volume to the combined gas exhaust volume through a second gas inlet, and
   wherein an opening into the combined gas exhaust volume from the first gas inlet is located below the plane of the first surface and an opening into the combined gas exhaust volume from the second gas inlet is located above the plane of the second surface.

2. The method of claim 1, wherein the plane of the first surface and plane of the second surface are substantially parallel.

3. The method of claim 2, wherein the processing gas and the purge gas are further evacuated through an exhaust pumping channel that is disposed radially outward of the gas exhaust volume between the plane of the first surface and the chamber base.

4. The method of claim 1, wherein the one or more gaseous precursors comprise silicon.

5. The method of claim 1, wherein the one or more gaseous precursors comprise TEOS.

6. The method of claim 5, wherein the purge gas comprises oxygen.

7. The method of claim 6, wherein a flowrate of the one or more gaseous precursors into the first volume is between about 5 gm/min and about 25 gm/min.

8. The method of claim 6, further comprising maintaining the substrate at a temperature between about 350° C. and about 550° C.

9. The method of claim 1, wherein a flowrate of the purge gas is between about 1 slm and about 10 slm.

10. The method of claim 1, wherein the one or more gaseous precursors are delivered to the first volume through a showerhead coupled to an RF power supply.

11. The method of claim 10, wherein a face plate of the showerhead is maintained at a temperature between about 100° C. and about 300° C.

12. The method of claim 1, wherein the processing chamber comprises:
   a first liner disposed in a circumferential channel of the chamber body,
   wherein the first liner is located between the plane of the second surface and the chamber base;
   a second liner disposed radially inwardly of the first liner,
   wherein the first liner and the second liner define an exhaust channel; and
   a third liner disposed radially inwardly of the one or more sidewalls between the first liner and the chamber lid,
   wherein the second liner, the third liner, and a third surface of the substrate support, connecting the first and second surfaces, define the combined gas exhaust volume when the substrate support is in a raised position, and
   wherein the first gas inlet to the combined gas exhaust volume is disposed between the third surface of the substrate support and the third liner and the second gas inlet to the combined gas exhaust volume is disposed between the third surface of the substrate support and the second liner when the substrate support is in the raised position.

13. The method of claim 12, wherein a width of the first gas inlet is between about 0.5 mm and about 10 mm.

14. The method of claim 13, wherein a width of the second gas inlet is between about 1 mm and about 3 mm.

15. A method of processing a substrate, comprising:
   positioning a substrate on a first surface of a substrate support disposed in a processing volume of a processing chamber, wherein the processing volume comprises a first volume disposed between a chamber lid and the substrate support and a second volume disposed between the substrate support and a chamber base;
   heating the substrate to a temperature between about 350° C. and about 550° C.;
   flowing a purge gas into the second volume, the purge gas comprising $O_2$;
   flowing a gaseous precursor comprising TEOS into the first volume;
   forming a plasma of the gaseous precursor;
   exposing the substrate to the plasma; and
   depositing an oxide layer on the substrate while simultaneously evacuating a processing gas and the purge gas from the second volume,
   wherein the processing gas comprises one or both of unreacted TEOS gas or TEOS gas reaction byproducts, wherein the processing gas and the purge gas are evacuated through a combined gas exhaust volume disposed between a plane of a first surface and the chamber base, wherein the processing gas is evacuated from the first volume through a first gas inlet to the combined gas exhaust volume and the purge gas is evacuated from the second volume through a second gas inlet to the combined gas exhaust volume, and wherein an opening into the combined gas exhaust volume from the first gas inlet is located below the plane of the first surface and an opening into the combined gas exhaust volume from the second gas inlet is located above the plane of a second surface.

16. The method of claim 15, wherein the, wherein the plane of the first surface and the plane of the second surface are substantially parallel.

17. An processing chamber, comprising:
a chamber body having a chamber base, one or more sidewalls, and a chamber lid defining a processing volume;
a substrate support disposed in the processing volume, the substrate support having a first surface, a second surface opposite the first surface, and a third surface connecting the first surface and the second surface around a circumference of the substrate support;
a first liner disposed in a circumferential channel in the chamber body,
wherein the first liner is located between a plane of the second surface and the chamber base;
a second liner disposed radially inwardly of the first liner, wherein the first liner and the second liner define an exhaust channel; and
a third liner disposed radially inwardly of the one or more sidewalls between the first liner and the chamber lid,
wherein the second liner, the third liner, and the third surface of the substrate support define a combined gas exhaust volume when the substrate support is in a raised position,
wherein a first inlet to the combined gas exhaust volume is disposed between the substrate support and the third liner and a second inlet to the combined gas exhaust volume is disposed between the substrate support and the second liner when the substrate support is in the raised position, and
wherein an opening into the combined gas exhaust volume from the first inlet is below the plane of the first surface and an opening into the combined gas exhaust volume form the second inlet is above the plane of the second surface when the substrate support is in the raised position.

18. The processing chamber of claim 17, wherein a width of the first inlet is between about 0.5 mm and about 10 mm.

19. The processing chamber of claim 18, wherein a width of the second inlet is between about 1 mm and about 3 mm.

20. The processing chamber of claim 19, further comprising a showerhead disposed in a chamber lid.

* * * * *

UNITED STATES PATENT AND TRADEMARK OFFICE
CERTIFICATE OF CORRECTION

PATENT NO. : 10,312,076 B2
APPLICATION NO. : 15/917079
DATED : June 4, 2019
INVENTOR(S) : Kalyanjit Ghosh et al.

Page 1 of 1

It is certified that error appears in the above-identified patent and that said Letters Patent is hereby corrected as shown below:

In the Specification

In Column 8, Line 56, delete "403," and insert -- 403 --, therefor.

In the Claims

In Column 13, Line 14, in Claim 16, after "claim 15," delete "wherein the,".

Signed and Sealed this
Thirtieth Day of July, 2019

Andrei Iancu
*Director of the United States Patent and Trademark Office*